United States Patent
Chen et al.

(10) Patent No.: US 11,205,762 B2
(45) Date of Patent: Dec. 21, 2021

(54) DISPLAY SUBSTRATE WITH MICROPRISM STRUCTURE AND MANUFACTURING METHOD THEREFOR

(71) Applicant: BOE TECHNOLOGY GROUP CO., LTD., Beijing (CN)

(72) Inventors: Yu Ju Chen, Beijing (CN); Zhuo Chen, Beijing (CN); Gang Yu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/641,354

(22) PCT Filed: Mar. 18, 2019

(86) PCT No.: PCT/CN2019/078514
§ 371 (c)(1),
(2) Date: Feb. 24, 2020

(87) PCT Pub. No.: WO2019/179395
PCT Pub. Date: Sep. 26, 2019

(65) Prior Publication Data
US 2020/0388782 A1    Dec. 10, 2020

(30) Foreign Application Priority Data
Mar. 19, 2018    (CN) .......................... 201810224703.0

(51) Int. Cl.
*H01L 33/00*    (2010.01)
*H01L 51/50*    (2006.01)
(Continued)

(52) U.S. Cl.
CPC ...... *H01L 51/5072* (2013.01); *H01L 51/5275* (2013.01); *H01L 51/56* (2013.01);
(Continued)

(58) Field of Classification Search
CPC .. H01L 51/56; H01L 51/5072; H01L 51/5275
See application file for complete search history.

(56) References Cited

U.S. PATENT DOCUMENTS 8,237,158 B2    8/2012    Chao
8,384,111 B2    2/2013    Tadatomo et al.
(Continued)

FOREIGN PATENT DOCUMENTS

CN    101159307 A    4/2008
CN    102157696 A    8/2011
(Continued)

OTHER PUBLICATIONS

International Search Report of PCT/CN2019/078514 in Chinese, dated Jun. 24, 2019, with English translation.
(Continued)

*Primary Examiner* — Phuc T Dang
(74) *Attorney, Agent, or Firm* — Collard & Roe, P.C.

(57) ABSTRACT

A display substrate and a manufacturing method thereof are provided. The manufacturing method includes: providing a base substrate; and forming a luminescent element on the base substrate which includes sequentially forming of a first electrode, a luminescent material layer and a second electrode on the base substrate, and a microprism structure is formed on a light-emitting side of the luminescent material layer.

18 Claims, 6 Drawing Sheets

(51) Int. Cl.
*H01L 51/52* (2006.01)
*H01L 51/56* (2006.01)

(52) U.S. Cl.
CPC ...... *H01L 51/5225* (2013.01); *H01L 51/5234* (2013.01); *H01L 2251/305* (2013.01); *H01L 2251/5315* (2013.01)

(56) References Cited

U.S. PATENT DOCUMENTS

| | | | |
|---|---|---|---|
| 9,065,075 | B1 | 6/2015 | Jeon et al. |
| 9,650,709 | B2 | 5/2017 | Zhao et al. |
| 2015/0137103 | A1* | 5/2015 | Hosono ............... H01L 51/5012 257/40 |
| 2015/0236300 | A1* | 8/2015 | Naraoka ............. H01L 51/5262 257/40 |
| 2016/0141528 | A1* | 5/2016 | Masuyama ......... H01L 51/5275 257/40 |
| 2017/0365817 | A1 | 12/2017 | Wang |
| 2018/0166643 | A1* | 6/2018 | Kim .................... H01L 51/502 |

FOREIGN PATENT DOCUMENTS

| | | |
|---|---|---|
| CN | 102362018 A | 2/2012 |
| CN | 103952665 A | 7/2014 |
| CN | 104183722 A | 12/2014 |
| CN | 104218154 A | 12/2014 |
| CN | 104716159 A | 6/2015 |
| CN | 105355798 A | 2/2016 |
| CN | 106399936 A | 2/2017 |
| CN | 108321312 A | 7/2018 |

OTHER PUBLICATIONS

First Chinese Office Action in Chinese Application No. 201810224703.0, dated April 9, 2019 with English translation.
Second Chinese Office Action in Chinese Application No. 201810224703.0, dated Sep. 16, 2019 with English translation.

* cited by examiner

DISPLAY SUBSTRATE WITH MICROPRISM STRUCTURE AND MANUFACTURING METHOD THEREFOR

CROSS REFERENCE TO RELATED APPLICATIONS

This application is the National Stage of PCT/CN2019/078514 filed on Mar. 18, 2019, which claims priority under 35 U.S.C. § 119 of Chinese Application No. 201810224703.0 filed on Mar. 19, 2018, the disclosure of which is incorporated by reference.

TECHNICAL FIELD

The embodiments of the present disclosure relate to a display substrate and a manufacturing method thereof.

BACKGROUND

The conventional luminous elements in the display substrate generally include an organic light-emitting diode (OLED), a quantum dot light-emitting diode (QLED), etc.

With the rapid development of display technology, QLED element has become the research emphasis in the display field. The QLED display substrate generally includes a driving circuit layer, QLED luminous elements and the like which are sequentially disposed on a base substrate. The driving circuit layer, for example, includes structures such as a plurality of thin-film transistors (TFTs) and capacitors. The QLED luminous element generally includes structures such as an anode, a quantum dot material layer and a cathode.

SUMMARY

At least one embodiment of the present disclosure provides a display substrate, the display substrate comprises a base substrate and a luminescent element, the luminescent element includes a first electrode, a luminescent material layer and a second electrode which are sequentially laminated on the base substrate, and a microprism structure is disposed on a light-emitting side of the luminescent material layer.

For example, in the display substrate provided by at least one embodiment of the present disclosure, the luminescent material layer is a layer in a luminescent function layer, the second electrode is disposed on a light-emitting side of the luminescent function layer, and the microprism structure is disposed between the luminescent function layer and the second electrode.

For example, in the display substrate provided by at least one embodiment of the present disclosure, the luminescent function layer further includes an electron transporting layer which is disposed on a light-emitting side of the luminescent material layer, the electron transporting layer has the microprism structure.

For example, in the display substrate provided by at least one embodiment of the present disclosure, the second electrode and the electron transporting layer are conformal.

For example, the display substrate provided by at least one embodiment of the present disclosure further comprises a driving circuit layer and a package layer, the driving circuit layer is disposed between the base substrate and the luminescent element, the package layer is disposed on a side of the second electrode away from the base substrate, and the second electrode, the package layer and the electron transporting layer are conformal.

For example, in the display substrate provided by at least one embodiment of the present disclosure, the luminescent material layer is a layer in a luminescent function layer, the luminescent function layer also includes a plurality of function layers disposed on a light-emitting side of the luminescent material layer, and a surface of one of the plurality of function layers has the microprism structure.

For example, in the display substrate provided by at least one embodiment of the present disclosure, an outmost layer of the luminescent function layer disposed on the light-emitting side has the microprism structure.

For example, in the display substrate provided by at least one embodiment of the present disclosure, a first layer of the luminescent function layer disposed between the luminescent material layer and the outmost layer on the light-emitting side has the microprism structure, and the first layer and a function layer of the luminescent function layer disposed on a light-emitting side of the first layer are conformal.

For example, in the display substrate provided by at least one embodiment of the present disclosure, the plurality of function layers include an electron transporting layer and an electron injection layer.

For example, in the display substrate provided by at least one embodiment of the present disclosure, the function layer with the microprism structure on a surface and the microprism structure are an integral structure formed by an identical material.

For example, in the display substrate provided by at least one embodiment of the present disclosure, the microprism structure includes a bottom surface and at least one side surface connected with the bottom surface, an included angle between the bottom surface and at least a portion of the at least one side surface connected with the bottom surface is greater than or equal to 45° and less than or equal to 90°.

For example, in the display substrate provided by at least one embodiment of the present disclosure, in a direction perpendicular to a surface of the display substrate, a cross-section of the microprism structure is triangular, rectangular, trapezoidal or cambered.

At least one embodiment of the present disclosure provides a method for manufacturing a display substrate, the method comprises: providing a base substrate; and forming a luminescent element on the base substrate which includes sequentially forming of a first electrode, a luminescent material layer and a second electrode on the base substrate, wherein a microprism structure is formed on a light-emitting side of the luminescent material layer.

For example, in the method provided by at least one embodiment of the present disclosure, the forming the microprism structure on the light-emitting side of the luminescent material layer includes: forming an electron transporting layer on the light-emitting side of the luminescent material layer, and forming the microprism structure by utilizing the electron transporting layer.

For example, the method provided by at least one embodiment of the present disclosure further comprises: forming a driving circuit layer on the base substrate and forming a package layer on a side of the second electrode away from the base substrate, and the luminescent element is formed on a side of the driving circuit layer away from the base substrate and forming a package layer on a side of the second electrode away from the base substrate, wherein the second electrode, the package layer and the electron transporting layer are conformal.

For example, in the method provided by at least one embodiment of the present disclosure, the forming the microprism structure by utilizing the electron transporting layer includes: forming a mask layer on a surface of the electron transporting layer away from the base substrate by utilizing an ink containing a metal particle; etching the electron transporting layer by using the mask layer, to form the microprism structure on a surface of the electron transporting layer away from the base substrate; and removing the mask layer.

For example, in the method provided by at least one embodiment of the present disclosure, the forming the mask layer includes: forming the mask layer by using an ink via a printing or a spin coating; the etching the electron transporting layer by using the mask layer includes: etching the electron transporting layer by using an inductively coupled plasma process or a high-density plasma process; and the removing the mask layer includes: removing the mask layer by utilizing a magnet or an electromagnet to adsorb the metal particle.

For example, in the method provided by at least one embodiment of the present disclosure, during etching the electron transporting layer, a flow rate of a plasma gas in an etching environment is adjusted, to control an etching rate of the electron transporting layer, and the flow rate of the plasma gas is positively related to the etching rate.

For example, in the method provided by at least one embodiment of the present disclosure, the metal particle is of spherical shape, a diameter of the metal particle is 50 nm to 100 μm.

For example, in the method provided by at least one embodiment of the present disclosure, the metal particle includes ferroferric oxide.

For example, in the method provided by at least one embodiment of the present disclosure, the electron transporting layer includes zinc oxide.

For example, in the method provided by at least one embodiment of the present disclosure, the second electrode is a cathode, and the forming the second electrode includes: conformally forming the second electrode on a surface of the electron transporting layer on which the microprism structure is formed by adoption of lithium fluoride or aluminum via an evaporation manner.

For example, in the method provided by at least one embodiment of the present disclosure, the second electrode is a cathode, and the forming the package layer on the second electrode includes: conformally forming the package layer on a side of the second electrode away from the base substrate by adoption of indium tin oxide or indium zinc oxide via a sputtering manner.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1A:
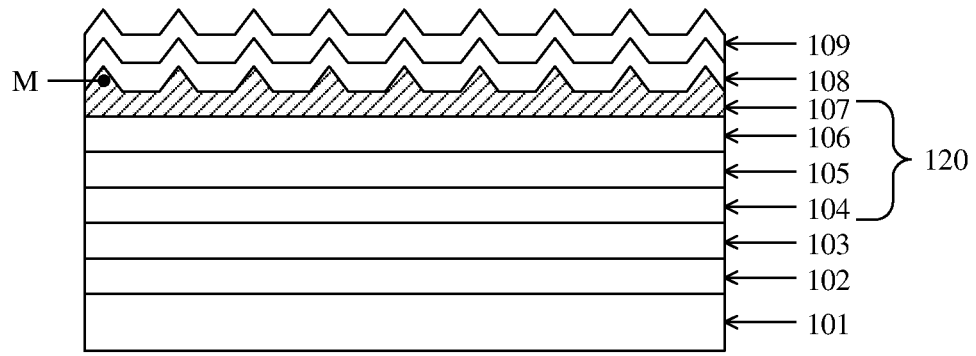
FIG. 1A is a schematic structural view of a display substrate provided by some embodiments of the present disclosure.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

A Luminous element of a display substrate includes an OLED, a QLED, etc. A layer structure in the OLED element is usually made from an organic material, and a layer structure in the QLED element is usually made from an inorganic material. For instance, a package layer of the OLED element generally includes an inorganic material, an organic material, or a combination of the inorganic material and the organic material, and a package layer of the QLED element generally includes an inorganic material, for example, includes the inorganic material such as ITO or IZO. As for a luminous element with a top-emission structure, due to high refractive index of the inorganic material, when the luminous element emits light, the light is prone to be totally reflected when entering the air from the package layer, so the luminous efficiency of the luminous element is low.

For instance, as for an OLED element and a QLED element with a top-emission structure, light is irradiated towards outside from a package layer in the element. As the refractive index of the inorganic material is generally higher than that of the organic material, for example, the refractive index of the package layer in the QLED element is usually 1.4-1.6 and the refractive index of the package layer in the OLED element is usually 1.2-1.4, when the element emits light, the light is prone to be totally reflected when entering the air from the package layer, so the luminous efficiency of the element is low. In some cases, compared with the OLED element, when the QLED element emits light, the light may be easier to be totally reflected when entering the air from the package layer, so the luminous efficiency of the QLED element is relatively low.

At least one embodiment of the present disclosure provides a display substrate, a manufacturing method thereof and a display device, which are capable of solving the problem of low luminous efficiency of the luminous element such as an OLED element or a QLED element in relevant technologies.

In order to make an object, a technical detail and an advantage of the embodiments of the present disclosure more apparent, further detailed description will be given below to the embodiments of the present disclosure with referenced to the accompanying drawings.

Some embodiments of the present disclosure provide a display substrate. As shown in FIG. 1A, the display substrate may comprise a base substrate 101 and a luminous element. The luminous element includes a first electrode 103, a luminescent material layer 106 and a second electrode 108 which are sequentially laminated on the base substrate 101. A microprism structure, e.g., a plurality of microprism structures, is disposed on a light-emitting side (for example, an upper side in the figure) of the luminescent material layer 106.

For instance, in some embodiments, the luminescent material layer 106 is one layer in a luminescent function layer 120; the second electrode 108 is disposed on a light-emitting side of the luminescent function layer 120; and the microprism structure is disposed between the luminescent function layer 120 and the second electrode 108.

For instance, in some examples, as shown in FIG. 1A, the luminescent function layer 120 includes a luminescent material layer 106 and an electron transporting layer 107 disposed on a side of the luminescent material layer 106 away from the base substrate 101. For example, the electron transporting layer 107 includes a microprism structure M. In this case, the microprism structure M is disposed between the luminescent function layer 120 and the second electrode 108. For instance, the second electrode 108 and the electron transporting layer 107 are conformal, so an interface between the second electrode 108 and the electron transporting layer 107 is an uneven interface.

Figure 1B:
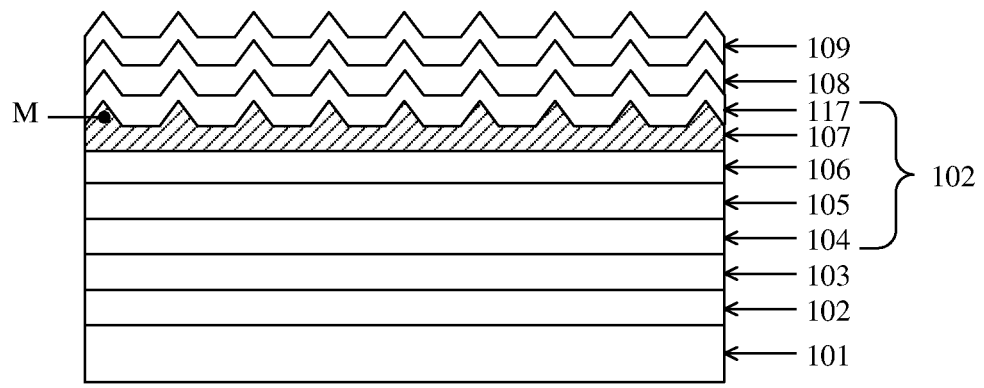
FIG. 1B is a schematic structural view of a display substrate provided by some embodiments of the present disclosure.
Figure 1C:
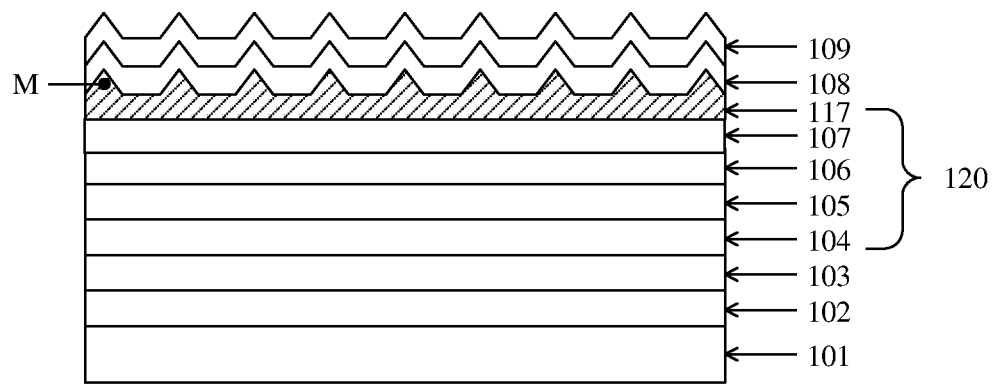
FIG. 1C is a schematic structural view of a display substrate provided by some embodiments of the present disclosure.
Figure 1D:
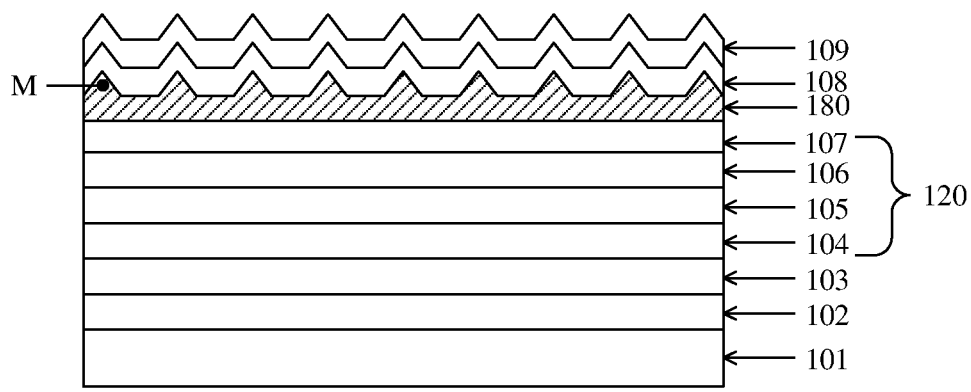
FIG. 1D is a schematic structural view of a display substrate provided by some embodiments of the present disclosure.

For instance, in some examples, as shown in FIG. 1D, other function layer may also be formed between the luminescent function layer 108 and the second electrode 120, and the function layer includes the microprism structure. For instance, a conductive layer 180 is formed between the luminescent function layer 108 and the second electrode 120, and the microprism structure M is formed on the conductive layer 180. The conductive layer 180, for example, includes materials such as zinc oxide, ITO and the like.

For instance, in some embodiments, the luminescent function layer 120 includes a plurality of function layers (the electron transporting layer 107 and an electron injection layer 117 described below) disposed on a light-emitting side of the luminescent material layer 106, and a surface of one of the plurality of function layers has the microprism structure. For instance, a first layer of the luminescent function layer 120, disposed between the luminescent material layer 106 and the outmost layer on the light-emitting side, includes the microprism structure, and the function layer of the luminescent function layer, disposed on a light-emitting side of the first layer, and the first layer are conformal. For instance, the outmost layer of the luminescent function layer 120 disposed on the light-emitting side includes the microprism structure.

For instance, in some examples, as shown in FIGS. 1B and 1C, the luminescent function layer 120 includes a luminescent material layer 106 and the electron transporting layer 107 and the electron injection layer 117 which are sequentially laminated on a side of the luminescent material layer 106 away from the base substrate 101. For instance, as shown in FIG. 1B, the electron transporting layer 107 includes the microprism structure M. At this point, the first layer of the luminescent function layer 120 disposed between the luminescent material layer 106 and the outmost layer on the light-emitting side is the electron transporting layer 107. Or, as shown in FIG. 1C, the electron injection layer 117 includes the microprism structure M. At this point, the outmost layer of the luminescent function layer 120 disposed on the light-emitting side has the microprism structure. For instance, the second electrode 108 above the luminescent function layer 120 and the electron transporting layer 107 or the electron injection layer 117 are conformal.

For instance, in some embodiments, as shown in FIGS. 1A-1D, the function layer with the microprism structure on the surface and the microprism structure are an integral structure formed by the same material. In other embodiments, the function layer with the microprism structure on the surface and the microprism structure may also be not an integral structure, namely are two independent structures.

For instance, in some embodiments, the luminescent function layer 120 also includes a hole transporting layer 105 and a hole injection layer 104 which are sequentially laminated on a side of the luminescent material layer 106 close to the base substrate 101.

For instance, in the luminous element, the electron transporting layer 107, the electron injection layer 117, the hole transporting layer 105 and the hole injection layer 104 in the luminescent function layer may be selectively arranged. For instance, as for the QLED, the luminescent material layer 106 includes a quantum dot luminescent material. As an electron transporting capacity of the quantum dot luminescent material is high, the electron injection layer 117 may be not arranged. For instance, as for the OLED, the luminescent material layer 106 includes an organic luminescent material. At this point, the above function layers (including the hole injection layer 104, the hole transporting layer 105, the electron transporting layer 107 and the electron injection layer 117) may be all arranged to improve the luminous efficiency of the luminous element. Of course, in some embodiments, several of the function layers may also be arranged according to actual conditions such as an adopted organic luminescent material.

For instance, as shown in FIGS. 1A-1C, the display substrate further comprises a driving circuit layer 102 and a package layer 109 disposed on the base substrate 101. For instance, the driving circuit layer 102 includes a plurality of thin film transistors and a capacitor, and the package layer 109 covers the luminous element to package the luminous element.

For instance, taking FIG. 1A as an example, a plurality of microprism structures M are formed on a surface of the electron transporting layer 107 away from the base substrate 101, and the second electrode 108 and the package layer 109 are conformally disposed on the surface of the electron transporting layer 107 away from the base substrate 101, so the second electrode 108 and the package layer 109 are an uneven structure. In the embodiment, the second electrode 108 and the package layer 109 are conformally formed on the surface of the electron transporting layer 107 away from the base substrate, that is, the electron transporting layer 107 and the second electrode 108 make nonplanar contact, and the second electrode 108 and the package layer 109 make nonplanar contact.

For instance, in some examples, the first electrode 103 is as an anode of the luminous element, and the second electrode 108 is as a cathode of the luminous element, which are not limited in the embodiment of the present disclosure. For instance, the structure including the anode, the hole injection layer, the hole transporting layer, the luminescent material layer, the electron transporting layer and the cathode (in some examples, also including the electron injection layer) may also be referred to as a self-luminescent element.

In the embodiment of the present disclosure, the above self-luminescent element may be a QLED element and may also be an OLED element, and the provided display substrate may be a top-emission structure and may also be a bottom-emission structure, which are not specifically limited in the embodiment of the present disclosure. For instance, when the display substrate is a bottom-emission structure, a light-emitting side of the QLED element is a side of the QLED element close to the base substrate. For example, the microprism structure is formed on a side of the luminescent material layer close to the base substrate. At this point, a surface on a side of the luminescent function layer close to the base substrate includes the microprism structure. For instance, when the self-luminescent element is a QLED element, the luminescent material layer may include a quantum dot material which can emit light of three colors red, green and blue, so as to form red pixels, green pixels and blue pixels in the self-luminescent element.

It should be noted that the total reflection condition of light includes: when the incident angle of light is greater than a critical angle θ (sin θ=a refractive index of an emergent medium/a refractive index of an incident medium) of the total reflection, the light will be totally reflected on a critical surface of the incident medium and the emergent medium.

For instance, in some examples, the electron transporting layer 107 includes zinc oxide, and the second electrode 108 is as a cathode and includes lithium fluoride or aluminum.

For instance, a thickness of a film layer formed by lithium fluoride or aluminum is less than 10 nm, to ensure the light transmittance of the film layer. For instance, a conductive layer may also be formed on the film layer formed by lithium fluoride or aluminum and may have the function of the package layer and may be taken as the package layer. For instance, the conductive layer includes ITO or IZO, and a thickness of the conductive layer may be 50-100 nm. Wherein, the refractive index of zinc oxide is greater than 2; the refractive index of ITO or IZO is 1.4-2; and the refractive index of lithium fluoride and aluminum is 0.6-1.6. For example, the refractive index of aluminum on light with a wavelength of 450 nm is 0.63; the refractive index of aluminum on light with a wavelength of 550 nm is 1.01; and the refractive index of aluminum on light with a wavelength of 650 nm is 1.56.

In summary, in the display substrate provided by some embodiments of the present disclosure, on one hand, as the microprism structure is disposed on the light-emitting side of the luminescent material layer, for example, a surface of the electron transporting layer or the electron injection layer away from the base substrate has the microprism structure, an interface between the second electrode and the electron transporting layer or the electron injection layer may be an uneven interface; and when light is irradiated to the second electrode (e.g., the cathode) and the package layer from the electron transporting layer or the electron injection layer, curvatures at different positions of the light-emitting surface are different, so an incident angle of the light is difficult to meet the total reflection condition, thereby reducing light which is totally reflected. On the other hand, as the package layer is an uneven structure, when light is irradiated to the external environment from inside of the display substrate through the package layer, curvatures at different positions of the light-emitting surface are different, so the incident angle of the light is difficult to satisfy the total reflection condition, and then the light subjected to total reflection is reduced. Thus, the light extraction efficiency of the display substrate is improved.

For instance, in some embodiments, the hole transporting layer 105 or the hole injection layer 104 may also include the microprism structure, or the luminescent function layer 102 may also include the other function layer, and the microprism structure is formed by utilization of the other function layer. The specific arrangement position of the microprism structure is not limited in the embodiment of the present disclosure, as long as a surface of the luminescent function layer 102 away from the base substrate 101 is an uneven structure.

The specific form of the other functional structure in the display substrate is not limited in the embodiment of the present disclosure. For instance, the thin film transistor (TFT) in the driving circuit layer 102 may include a gate metal pattern, a gate insulation layer, an active layer, a source/drain metal pattern and a passivation layer which are sequentially formed on the base substrate. For instance, in one example, the gate metal pattern may be prepared by metal molybdenum (Mo), and a thickness may be 200 nm; the gate insulation layer may be prepared by silicon dioxide ($SiO_2$), and a thickness may be 150 nm; the active layer may be prepared by indium gallium zinc oxide (IGZO), and a thickness may be 40 nm; the source/drain metal pattern may be prepared by metal Mo, and a thickness may be 200 nm; and the passivation layer may be prepared by silicon dioxide, and a thickness may be 300 nm.

Figure 2:
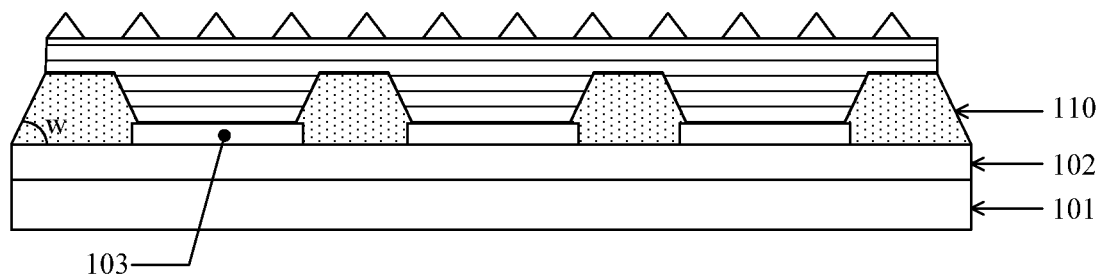
FIG. 2 is a schematic structural view of another display substrate provided by some embodiments of the present disclosure.

For instance, as shown in FIG. 2, the display substrate may further comprise a pixel define layer (PDL) 110. The PDL 110 includes a plurality of openings, to define a plurality of pixel units of the display substrate. For instance, in the manufacturing process of the display substrate, the first electrode 103 (for example, being an anode, which may also be referred to as a pixel electrode) and the PDL 110 may be sequentially formed on the base substrate 101 on which the driving circuit layer 102 is formed; then, the hole injection layer, the hole transporting layer, the luminescent material layer, the electron transporting layer (and the electron injection layer) and the like are sequentially formed in the plurality of openings of the PDL 110; and then, structures such as the cathode and the package layer (not shown in the figure) are formed. For instance, in one example, the first electrode 103 is as an anode and may be prepared by ITO, and a thickness may be 40 nm; the PDL 110 may be prepared by an acrylic material, and a thickness may be 0.7 μm; and a slope angle w (namely an included angle between an inclined surface and a bottom surface of the PDL) of the PDL 110 may be 60°.

Figure 3A:
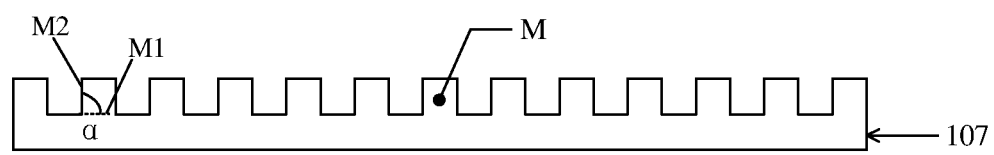
FIG. 3A is a schematic structural view of an electron transporting layer in some embodiments of the present disclosure.

For instance, in some embodiments, taking FIG. 3A as an example, the microprism structure includes a bottom surface M1 and at least one side surface M2 connected with the bottom surface M1. An included angle α between the bottom surface M1 and at least one portion of the at least one side surface M2 connected with the bottom surface M1 ranges from 45°-90° and may be equal to an end value.

For instance, the side surface may be a cambered surface or a curved surface rather than a flat surface, and an included angle between the cambered surface or the curved surface and the bottom surface refers to an included angle between a tangent plane of a point on the surface and the bottom surface.

Figure 3B:
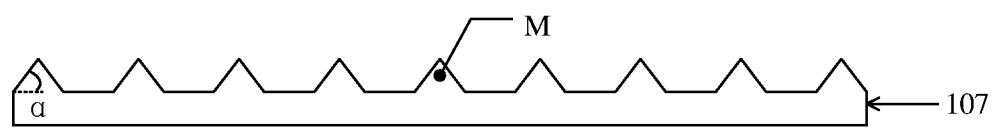
FIG. 3B is a schematic structural view of another electron transporting layer in some embodiments of the present disclosure.
Figure 3C:
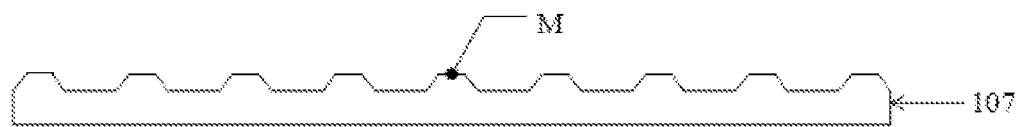
FIG. 3C is a schematic structural view of an electron transporting layer in some embodiments of the present disclosure.
Figure 3D:
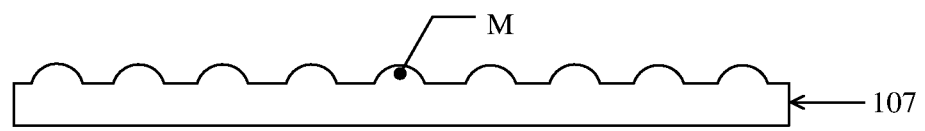
FIG. 3D is a schematic structural view of an electron transporting layer in some embodiments of the present disclosure.

For instance, as shown in FIG. 3A, in a direction perpendicular to the base substrate, a cross-section of the microprism structure M on the electron transporting layer 107 may be rectangular; or as shown in FIG. 3B, the cross-section of the microprism structure M on the electron transporting layer 107 may be triangular; or as shown in FIG. 3C, the cross-section of the microprism structure M on the electron transporting layer 107 may be trapezoidal; or as shown in FIG. 3D, the cross-section of the microprism structure M on the electron transporting layer 107 may be cambered. The specific shape of the microprism structure is not limited in the embodiment of the present disclosure.

Figure 4:
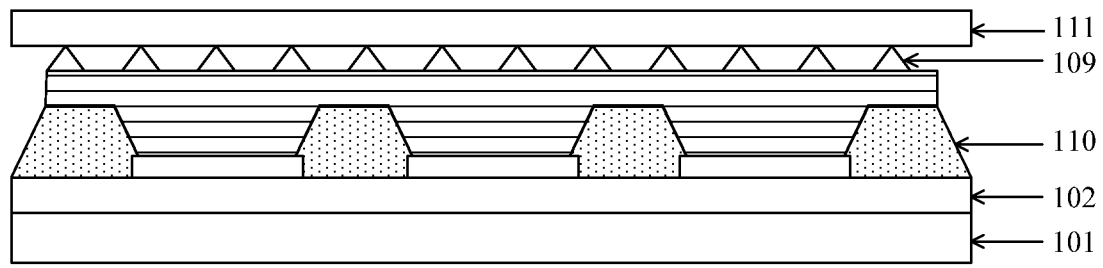
FIG. 4 is a schematic structural view of still another display substrate provided by some embodiments of the present disclosure.

For instance, as shown in FIG. 4, the display substrate may further comprise a circular polarizer 111 disposed on a side of the package layer 109 away from the base substrate 101. The circular polarizer 111 can prevent a user from viewing an internal structure of the display substrate from a display surface side of the display substrate under bright light condition, and avoids the impact on the appearance of the display device.

In summary, in the display substrate provided by some embodiments of the present disclosure, on one hand, as the microprism structure is disposed on the light-emitting side of the luminescent material layer, for example, a surface of the electron transporting layer or the electron injection layer away from the base substrate has the microprism structure, an interface between the second electrode and the electron transporting layer or the electron injection layer may be an uneven interface; and when light is irradiated to the second electrode and the package layer from the electron transporting layer or the electron injection layer, curvatures at different positions of the light-emitting surface are different, so an incident angle of the light is difficult to meet the total reflection condition, thereby reducing light which is totally reflected. On the other hand, as the package layer is an uneven structure, when light is irradiated to the external environment from inside of the display substrate through the package layer, curvatures at different positions of the light-emitting surface are different, so the incident angle of the light is difficult to satisfy the total reflection condition, and then the light subjected to total reflection is reduced. Thus, the light extraction efficiency of the display substrate is improved.

The embodiment of the present disclosure provides a display device, which comprises the display substrate provided by any foregoing embodiment. The display device has high luminous efficiency.

For instance, the display device may be any product or component having display function such as a liquid crystal display (LCD) panel, e-paper, a mobile phone, a tablet PC, a TV, a display, a notebook computer, a digital photo frame or a navigator.

In summary, in the display device provided by some embodiments of the present disclosure, on one hand, as the microprism structure is disposed on the light-emitting side of the luminescent material layer, for example, a surface of the electron transporting layer or the electron injection layer away from the base substrate has the microprism structure, an interface between the second electrode and the electron transporting layer or the electron injection layer may be an uneven interface; and when light is irradiated to the second electrode and the package layer from the electron transporting layer or the electron injection layer, curvatures at different positions of the light-emitting surface are different, so an incident angle of the light is difficult to meet the total reflection condition, thereby reducing light which is totally reflected. On the other hand, as the package layer is an uneven structure, when light is irradiated to the external environment from inside of the display substrate through the package layer, curvatures at different positions of the light-emitting surface are different, so the incident angle of the light is difficult to satisfy the total reflection condition, and then the light subjected to total reflection is reduced. Thus, the light extraction efficiency of the display substrate is improved.

The embodiment of the present disclosure further provides a method for manufacturing a display substrate. The manufacturing method comprises: providing a base substrate; and forming a luminous element on the base substrate, including: sequentially forming a first electrode, a luminescent material layer and a second electrode on the base substrate, and forming a microprism structure on a light-emitting side of the luminescent material layer.

For instance, in some embodiments, the luminescent material layer is one layer in the luminescent function layer; the second electrode is formed on a light-emitting side of the luminescent function layer; and the microprism structure is formed between the luminescent function layer and the second electrode.

For instance, in some embodiments, the luminescent function layer also includes a plurality of function layers disposed on the light-emitting side of the luminescent material layer, and a surface of one of the plurality of function layers has the microprism structure.

For instance, in some embodiments, as shown in FIG. 1A, the forming the microprism structure on the light-emitting side of the luminescent material layer includes: forming an electron transporting layer on a side of the luminescent material layer away from the base substrate, and forming the microprism structure by utilization of the electron transporting layer, for example, forming the microprism structure on a surface of the electron transporting layer away from the base substrate.

For instance, in some embodiments, as shown in FIGS. 1B and 1C, the forming the luminescent function layer includes: forming the luminescent material layer, and sequentially forming an electron transporting layer and an electron injection layer on a side of the luminescent material layer away from the base substrate. For example, as shown in FIG. 1B, the microprism structure may be formed on a surface of the electron transporting layer away from the base substrate after the electron transporting layer is formed; or as shown in FIG. 1C, the microprism structure may be formed on a surface of the electron injection layer away from the base substrate after the electron injection layer is formed.

Detailed description will be given below to the method for manufacturing the display substrate provided by the embodiment of the present disclosure by taking the case as shown in FIG. 1A as an example.

Figure 5:
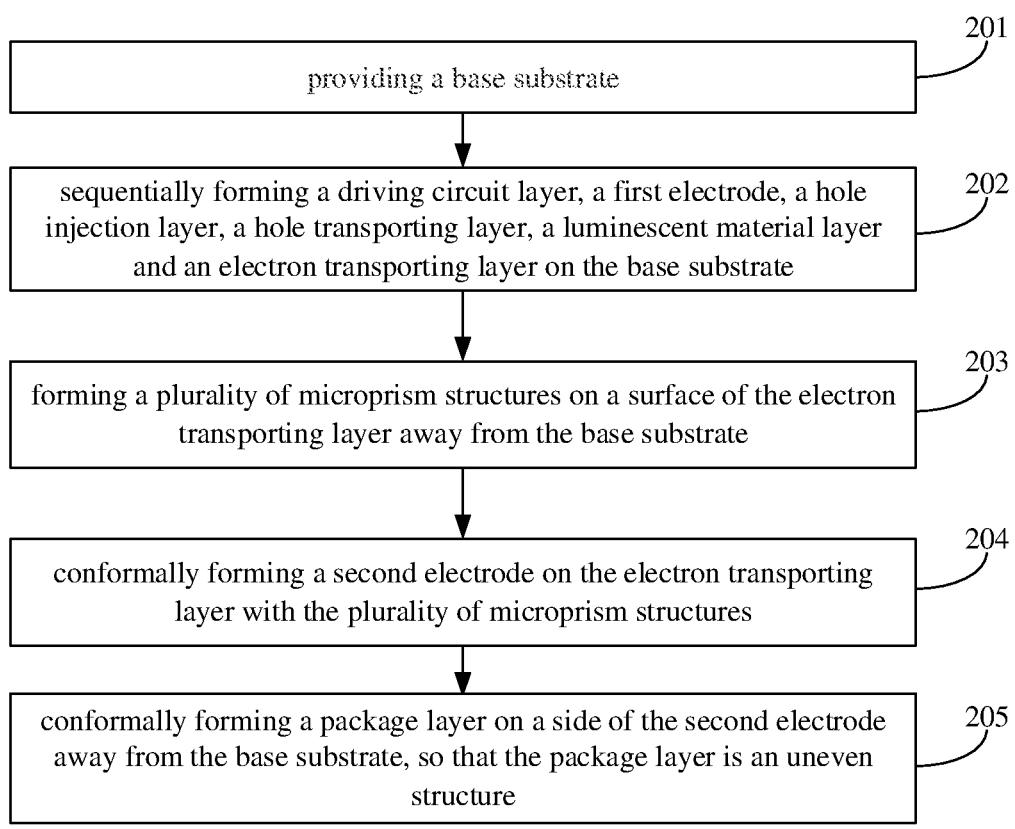
FIG. 5 is a flowchart illustrating a method for manufacturing a display substrate provided by some embodiments of the present disclosure.

For instance, FIG. 5 is a flowchart of a method for manufacturing a display substrate provided by some embodiments of the present disclosure. As shown in FIG. 5, the method may comprise:

S201: providing a base substrate.

S202: sequentially forming a driving circuit layer, a first electrode, a hole injection layer, a hole transporting layer, a luminescent material layer and an electron transporting layer on the base substrate.

S203: forming a plurality of microprism structures on a surface of the electron transporting layer away from the base substrate.

S204: conformally forming a second electrode on the electron transporting layer with the plurality of microprism structures.

S205: conformally forming a package layer on a side of the second electrode away from the base substrate, so that the package layer is an uneven structure.

A structure of the display substrate formed by the above method may refer to FIG. 1A.

In summary, in the manufacturing method of the display substrate provided by the embodiment of the present disclosure, the microprism structure is formed on the light-emitting side of the luminescent material layer, for example, the plurality of microprism structures are formed on a surface of the electron transporting layer or the electron injection layer away from the base substrate, and the second electrode (e.g., the cathode) and the package layer are sequentially and conformally formed on the electron transporting layer or the electron injection layer with the plurality of microprism structures, so the package layer is an uneven structure. On one hand, as the microprism structure is formed on the surface of the electron transporting layer or the electron injection layer away from the base substrate, when light is irradiated to the cathode and the package layer from the electron transporting layer, curvatures at different positions of the light-emitting surface are different, so the incident angle of the light is difficult to meet the total reflection condition, thereby reducing light which is totally reflected. On the other hand, as the package layer is an uneven structure, when light is irradiated to the external environment from inside of the display substrate through the package layer, curvatures at different positions of the light-emitting surface are different, so the incident angle of the light is difficult to satisfy the total reflection condition, and then the light which is totally reflected is reduced. Thus, the luminous efficiency of the display substrate is improved.

Figure 6:
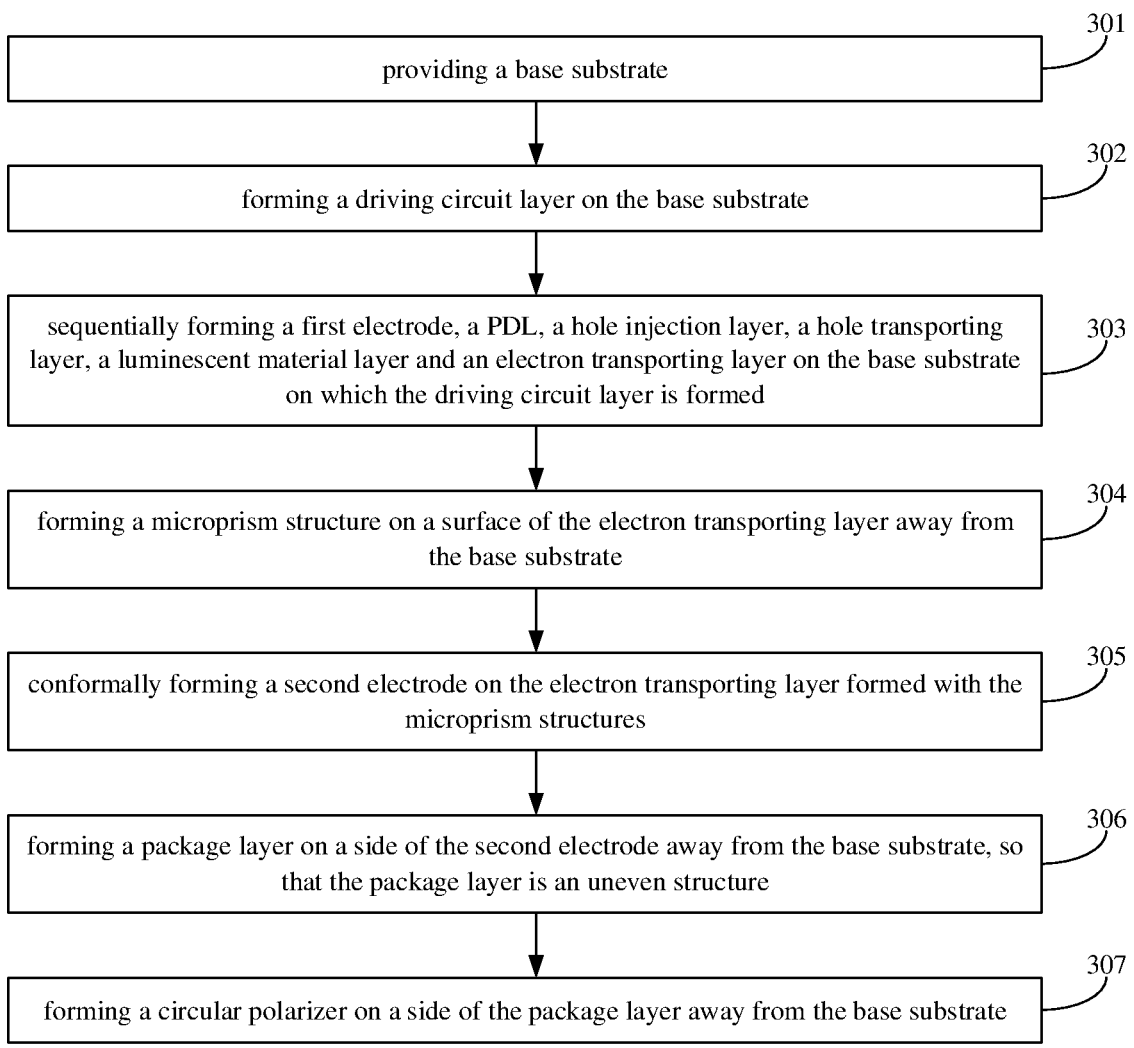
FIG. 6 is a flowchart illustrating another method for manufacturing a display substrate provided by some embodiments of the present disclosure.

FIG. 6 is a flowchart of another method for manufacturing a display substrate provided by the embodiment of the present disclosure. As shown in FIG. 6, the method may comprise:

S301: providing a base substrate.

For instance, the base substrate may be made from a transparent material such as a glass, a silicon wafer, quartz and plastics.

S302: forming a driving circuit layer on the base substrate.

For instance, the driving circuit layer includes structures such as a plurality of TFTs. For example, the TFT is a top-gate type TFT and may also be a bottom-gate type TFT, which is not limited in the embodiment of the present disclosure. For example, a process of forming the bottom-gate type TFT on the base substrate may include:

S11: forming a metal Mo layer with a thickness of 200 nm on the base substrate by deposition, and then forming a gate metal pattern by a patterning process.

S12: forming a silicon dioxide film layer with a thickness of 150 nm on the base substrate on which the gate metal pattern is formed by deposition, and then forming a gate insulation layer by a patterning process.

S13: forming an indium gallium zinc oxide layer with a thickness of 40 nm on the base substrate on which the gate insulation layer is formed by deposition, and then forming an active layer by a patterning process.

S14: forming a metal Mo layer with a thickness of 200 nm on the base substrate on which the active layer is formed by deposition, and forming a source/drain metal pattern by a patterning process.

S15: forming a silicon dioxide layer with a thickness of 300 nm on the base substrate on which the source/drain metal pattern is formed, and then forming a passivation layer by a patterning process.

Wherein, one patterning process may include: processes such as photoresist coating, exposure, development, etching, and photoresist stripping.

It should be noted that the above embodiment is only illustrative description; in some embodiments, the gate metal pattern and the source/drain metal pattern may also be made from a material such as aluminum, and the gate insulation layer and the passivation may also be made from a material such as nitrogen dioxide; and both a material and a thickness of the layer structures in the TFT are not limited in the embodiment of the present disclosure.

S303: sequentially forming a first electrode, a PDL, a hole injection layer, a hole transporting layer, a luminescent material layer and an electron transporting layer on the base substrate on which the driving circuit layer is formed.

For instance, the first electrode is an anode of the luminescent element, the first electrode is formed by forming a metal layer on the base substrate on which the driving circuit layer is formed by means of depositing ITO and then by utilizing a patterning process; and then, an acrylic layer is formed on the base substrate on which the first electrode is formed by the spin coating or deposition of an acrylic material, and a PDL is formed by processes such as photolithography and curing. The PDL formed by the patterning process includes a plurality of openings to define a plurality of pixel units of the display substrate. For instance, the slope angle of the PDL may be 60°, and a thickness of the PDL may be 0.7 μm.

For instance, after a surface of the PDL away from the base substrate is treated by a plasma technology, the hole injection layer and the hole transporting layer are formed in the plurality of openings of the PDL by a process such as an inkjet printing. For instance, the hole injection layer may be prepared by thermoplastic polymer PEDOT:PSS(3,4-ethylene dioxythiophene/polystyrene sulfonate); the hole transporting layer may be prepared by 1,2,4,5-Tetrakis (trifluoromethyl) Benzene (TFB); and a total thickness of the hole injection layer and the hole transporting layer may be 50-100 nm. Then, the luminescent material layer (for example, a quantum dot luminescent material layer or an organic luminescent material layer) is sequentially formed by, for example, inkjet printing, and then the electron transporting layer is formed by inkjet printing, sputtering or the like. A thickness of the electron transporting layer may be 30-200 nm.

For instance, the electron transporting layer may be prepared by zinc oxide. For instance, in other embodiments, an electron injection layer may also be formed on the electron transporting layer and may be prepared by cesium oxide ($Cs_2O$), cesium carbonate ($Cs_2CO_3$), etc.

S304: forming a microprism structure on a surface of the electron transporting layer away from the base substrate.

Figure 7:
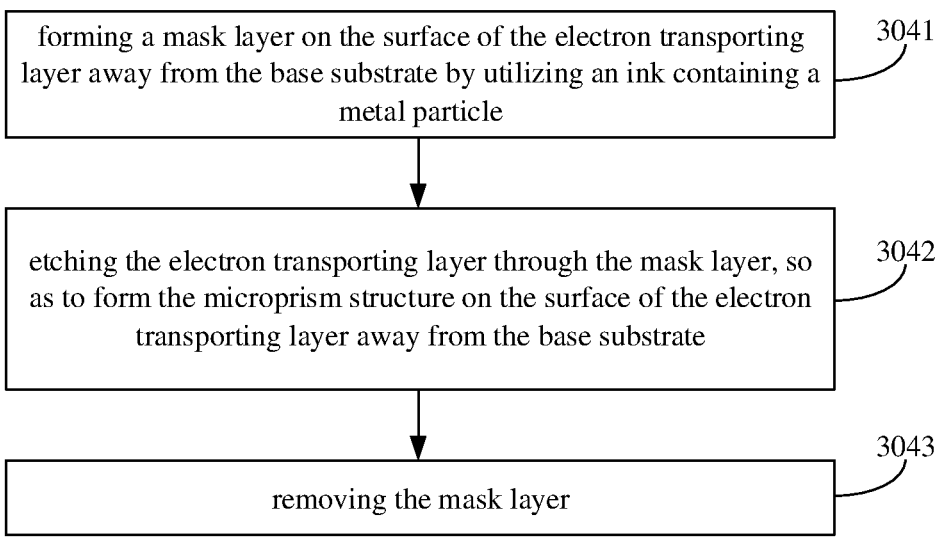
FIG. 7 is a flowchart illustrating a method for forming microprism structures in some embodiments of the present disclosure.

For instance, a plurality of microprism structures are formed on the surface of the electron transporting layer away from the base substrate. For instance, in one example, the flowchart of the method for forming the plurality of microprism structures may be shown in FIG. 7. The method comprises:

S3041: forming a mask layer on the surface of the electron transporting layer away from the base substrate by utilizing an ink containing a metal particle.

For instance, the mask layer is formed on the electron transporting layer by printing or spin coating. Illustratively, a material of the metal particle may be ferroferric oxide ($Fe_3O_4$); the metal particle may be of spherical shape; and a diameter of the metal particle may be 50 nm to 100 μm. The shape, the material and the size of the metal particle are all not limited in the embodiment of the present disclosure.

S3042: etching the electron transporting layer through the mask layer, so as to form the microprism structure on the surface of the electron transporting layer away from the base substrate.

For instance, the electron transporting layer is etched by utilizing an inductively coupled plasma process or high-density plasma process from a side of the mask layer away from the base substrate, so as to form a plurality of microprism structures on the surface of the electron transporting layer away from the base substrate.

For instance, in the process of etching the electron transporting layer, the flow rate of plasma gas in an etching environment may be adjusted to control an etching rate of the electron transporting layer, in which the flow rate of the plasma gas is positively related to the etching rate.

For instance, when the electron transporting layer is etched by the inductively coupled plasma process, the microprism structure obtained by etching may be pillared, for example, may be shown in FIG. 3A; when the electron transporting layer is etched by the high-density plasma process, when the flow rate of the plasma gas is 0, the microprism structure obtained by etching may be in the shape of a quadrihedron, for example, may be shown in FIG. 3B; and when the flow rate of the plasma gas is 50 sccm (standard milliliter per minute), as the etching rate is rapid, the microprism structure obtained by etching may be pillared.

For instance, in some examples, the flow rate of plasma gas may be adjusted to be 0.5 sccm or 50 sccm, which is not limited in the embodiment of the present disclosure. For instance, the plasma gas may be oxygen, nitrogen, argon, etc.

S3043: removing the mask layer.

For instance, in some examples, the mask layer may be removed by adoption of a strong magnet (such as a permanent magnet) or an electromagnet to adsorb the metal particle. For instance, the metal particle may be adsorbed at a position which is at a distance of 1 μm from the mask layer in air or a non-polar solvent (such as an orthogonal solvent of zinc oxide, that is, a solvent that does not dissolve zinc oxide) by using a magnet whose magnetic induction is greater than 1 tesla, to remove the mask layer. Moreover, absorbing the metal particle at the position which is at a distance of 1 μm from the mask layer can avoid the damage on structures of the display substrate.

For instance, in some examples, the plurality of microprism structures may also be formed on a surface of the electron transporting layer away from the base substrate by a patterning process, which is not limited in the embodiment of the present disclosure.

S305: conformally forming a second electrode on the electron transporting layer formed with the microprism structures.

For instance, the second electrode is a cathode and may be conformally formed on the electron transporting layer formed with the plurality of microprism structures by adoption of lithium fluoride or aluminum via evaporation. A thickness of the film layer prepared by lithium fluoride or aluminum is less than 10 nm to ensure the light transmittance of the film layer.

S306: forming a package layer on a side of the second electrode away from the base substrate, so that the package layer is an uneven structure.

For instance, the package layer may be conformally formed on a side of the second electrode away from the base substrate by adoption of ITO or IZO via sputtering.

S307: forming a circular polarizer on a side of the package layer away from the base substrate.

For instance, the circular polarizer may be bonded to a side of the package layer away from the base substrate, so as to prevent an user from viewing the internal structure of the display substrate from the display surface side of the display substrate under bright light condition and avoid the impact on the appearance of the display device.

It should be noted that the order of the steps in the method for manufacturing the display substrate provided by the embodiments of the present disclosure may be appropriately adjusted, and the steps may be increased or decreased accordingly as required. Any method which can be easily thought out by those skilled in the art within the technical scope disclosed in the present disclosure should all fall within the protection scope of the present disclosure, so no further description will be given here.

In summary, in the method for manufacturing the display substrate provided by the embodiment of the present disclosure, the microprism structure is formed on the light-emitting side of the luminescent material layer, for example, the plurality of microprism structures are formed on the surface of the electron transporting layer or the electron injection layer away from the base substrate, and the cathode and the package layer are sequentially and conformally formed on the electron transporting layer or the electron injection layer provided with the plurality of microprism structures, so the package layer is an uneven structure. on one hand, as the microprism structure is formed on the surface of the electron transporting layer or the electron injection layer away from the base substrate, when light is irradiated to the second electrode (for example the cathode) and the package layer from the electron transporting layer or the electron injection layer, curvatures at different positions of the light-emitting surface are different, so the incident angle of the light is difficult to meet the total reflection condition, thereby reducing light which is totally reflected. on the other hand, as the package layer is an uneven structure, when light is irradiated to the external environment from the inside of the display substrate through the package layer, curvatures at different positions of the light-emitting surface is different, so the incident angle of the light is difficult to satisfy the total reflection condition, and then the light which is totally reflected is reduced. thus, the luminous efficiency of the display substrate is improved.

It should be noted that in the embodiment of the present disclosure, "conformally" refers to having the same topography or maintaining the same shape. For example, when the second layer is disposed on the first layer, the second layer has the same or similar surface topography as the first layer.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged or reduces, that is, the accompanying drawings are not drawn according to the actual scale. However, it should be understood that, in the case in which a component or element such as a layer, film, region, substrate or the like is referred to be "on" or "under" another component or element, it may be directly on or under the another component or element or a component or element is interposed therebetween.

(3) In case of no conflict, features in one embodiment or in different embodiments can be combined to obtain a new embodiment.

What are described above is related to the specific embodiments of the disclosure only and not limitative to the scope of the disclosure. The protection scope of the disclosure shall be based on the protection scope of the claims.

What is claimed is:

1. A display substrate, comprising:
    a base substrate;
    a luminescent element, including a first electrode, a luminescent material layer and a second electrode which are sequentially laminated on the base substrate, and a microprism structure being disposed on a light-emitting side of the luminescent material layer,
    a driving circuit layer, disposed between the base substrate and the luminescent element; and
    a package layer, disposed on a side of the second electrode away from the base substrate,
    wherein the second electrode, the package layer and an electron transporting layer are conformal.

2. The display substrate according to claim 1, wherein the luminescent material layer is a layer in a luminescent function layer, the second electrode is disposed on the light-emitting side of the luminescent function layer, and the microprism structure is disposed between the luminescent function layer and the second electrode.

3. The display substrate according to claim 2, wherein the luminescent function layer further includes an electron transporting layer which is disposed on the light-emitting side of the luminescent material layer, the electron transporting layer has the microprism structure.

4. The display substrate according to claim 3, wherein the second electrode and the electron transporting layer are conformal.

5. The display substrate according to claim 1, wherein the luminescent material layer is a layer in a luminescent function layer, the luminescent function layer also includes a plurality of function layers disposed on the light-emitting side of the luminescent material layer, and a surface of one of the plurality of function layers has the microprism structure.

6. The display substrate according to claim 5, wherein an outmost layer of the luminescent function layer disposed on the light-emitting side has the microprism structure.

7. The display substrate according to claim 5, wherein a first layer of the luminescent function layer disposed between the luminescent material layer and the outmost layer on the light-emitting side has the microprism structure, and the first layer and a function layer of the luminescent function layer disposed on a light-emitting side of the first layer are conformal.

8. The display substrate according to claim 5, wherein the function layer with the microprism structure on a surface and the microprism structure are an integral structure formed by an identical material.

9. The display substrate according to claim 1, wherein the microprism structure includes a bottom surface and at least one side surface connected with the bottom surface, an included angle between the bottom surface and at least a portion of the at least one side surface connected with the bottom surface is greater than or equal to 45° and less than or equal to 90°.

10. The display substrate according to claim 1, wherein in a direction perpendicular to a surface of the display substrate, a cross-section of the microprism structure is triangular, rectangular, trapezoidal or cambered.

11. A method for manufacturing a display substrate, comprising:
    providing a base substrate;
    forming a luminescent element on the base substrate which includes sequentially forming of a first electrode, a luminescent material layer and a second electrode on the base substrate;
    forming a driving circuit layer on the base substrate, wherein the luminescent element is formed on a side of the driving circuit layer away from the base substrate; and
    forming a package layer on a side of the second electrode away from the base substrate,
    wherein the second electrode, the package layer and an electron transporting layer are conformal, and a microprism structure is formed on a light-emitting side of the luminescent material layer.

12. The method according to claim 11, wherein the forming the microprism structure on the light-emitting side of the luminescent material layer includes:
    forming the electron transporting layer on the light-emitting side of the luminescent material layer, and forming the microprism structure by utilizing the electron transporting layer.

13. The method according to claim 12, wherein the forming the microprism structure by utilizing the electron transporting layer includes:
    forming a mask layer on a surface of the electron transporting layer away from the base substrate by utilizing an ink containing a metal particle;

etching the electron transporting layer by using the mask layer, to form the microprism structure on a surface of the electron transporting layer away from the base substrate; and removing the mask layer.

14. The method according to claim 13, wherein the forming the mask layer includes:

forming the mask layer by using an ink via a printing or a spin coating;

the etching the electron transporting layer by using the mask layer includes:

etching the electron transporting layer by using an inductively coupled plasma process or a high-density plasma process; and the removing the mask layer includes:

removing the mask layer by utilizing a magnet or an electromagnet to adsorb the metal particle.

15. The method according to claim 13, wherein during etching the electron transporting layer, a flow rate of a plasma gas in an etching environment is adjusted, to control an etching rate of the electron transporting layer, and the flow rate of the plasma gas is positively related to the etching rate.

16. The method according to claim 13, wherein the metal particle is of spherical shape, a diameter of the metal particle is 50 nm to 100 μm, and the metal particle includes ferroferric oxide.

17. The method according to claim 12, wherein the electron transporting layer includes zinc oxide.

18. The method according to claim 12, wherein the second electrode is a cathode, and the forming the second electrode includes:

conformally forming the second electrode on a surface of the electron transporting layer on which the microprism structure is formed by adoption of lithium fluoride or aluminum via an evaporation manner, and the forming the package layer on the second electrode includes:

conformally forming the package layer on a side of the second electrode away from the base substrate by adoption of indium tin oxide or indium zinc oxide via a sputtering manner.

* * * * *